United States Patent
Yu

(10) Patent No.: US 9,269,717 B2
(45) Date of Patent: Feb. 23, 2016

(54) EEPROM DEVICE AND FORMING METHOD AND ERASING METHOD THEREOF

(71) Applicant: Shanghai Huahong Grace Semiconductor Manufacturing Corporation, Shanghai (CN)

(72) Inventor: Tao Yu, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 14/587,472

(22) Filed: Dec. 31, 2014

(65) Prior Publication Data
US 2015/0255476 A1 Sep. 10, 2015

(30) Foreign Application Priority Data

Mar. 6, 2014 (CN) .......................... 2014 1 0081177

(51) Int. Cl.
| | |
|---|---|
| H01L 21/336 | (2006.01) |
| H01L 29/788 | (2006.01) |
| H01L 27/115 | (2006.01) |
| G11C 16/14 | (2006.01) |
| H01L 29/66 | (2006.01) |
| G11C 16/04 | (2006.01) |

(52) U.S. Cl.
CPC ...... *H01L 27/11521* (2013.01); *G11C 16/0458* (2013.01); *G11C 16/14* (2013.01); *H01L 27/11519* (2013.01); *H01L 29/66825* (2013.01); *H01L 29/788* (2013.01)

(58) Field of Classification Search
CPC .................... H01L 27/11526; H01L 27/11521; H01L 29/6625; H01L 29/788; G11C 16/14
USPC .......................................... 257/316; 438/258
See application file for complete search history.

(56) References Cited

U.S. PATENT DOCUMENTS

| | | | |
|---|---|---|---|
| 2014/0175529 A1* | 6/2014 | Park ................... | H01L 29/42324 257/316 |
| 2015/0001607 A1* | 1/2015 | Lee .................... | H01L 29/42324 257/321 |
| 2015/0021679 A1* | 1/2015 | Tsair ..................... | H01L 29/788 257/320 |

FOREIGN PATENT DOCUMENTS

CN         101202311 A     6/2008

* cited by examiner

*Primary Examiner* — David S Blum
(74) *Attorney, Agent, or Firm* — Harness, Dickey & Pierce, P.L.C.

(57) ABSTRACT

An EEPROM device, a forming method thereof, and a method for implementing an erase operation to the device are provided. The EEPROM device includes: a semiconductor substrate having active regions therein; a word line disposed on a first active region; float gate dielectric layers disposed on second active regions; float gates disposed on the float gate dielectric layers, wherein each of the float gates has a width larger than that of the second active region; control gates disposed on control gate dielectric layers which are disposed on the float gates; an isolation oxide layer disposed between the word line and the float gates along with the control gates; and bit line doping regions disposed on third active regions. Accordingly, an erase operation can be implemented from a bit line, and coupling ratios of a float gate to a control gate and to a bit line doping region can be improved.

15 Claims, 12 Drawing Sheets

EEPROM DEVICE AND FORMING METHOD AND ERASING METHOD THEREOF

CROSS-REFERENCE TO RELATED APPLICATIONS

The present application claims priority to Chinese patent application No. 201410081177.9, filed on Mar. 6, 2014, and entitled "EEPROM DEVICE AND FORMING METHOD AND ERASING METHOD THEREOF", the entire disclosure of which is incorporated herein by reference.

TECHNICAL FIELD

The present disclosure generally relates to memory devices, and more particularly, to an Electrically Erasable and Programmable Read Only Memory (EEPROM) device, a method for forming the EEPROM device, and a method for implementing an erase operation to the EEPROM device.

BACKGROUND

Read Only Memory (ROM) devices are non-volatile memory devices, thus information and data stored therein will not be lost when power supplies are shut off. Erasable and Programmable Read Only Memory (EPROM) devices have expanded applications of the ROM devices to achieve an erase operation and a re-write operation. However, ultraviolet rays are required to achieve the erase operation, thus manufacturing costs of the EPROM devices are high. Furthermore, when implementing an erase operation to revise data, all programs or data stored in the EPROM device will be erased. Thus, after the erase operation, the EPROM device should be reprogrammed which is time-consuming.

Electrically Erasable and Programmable Read Only Memory (EEPROM) devices can achieve erase operations without above recited deficiencies of the EPROM devices. When erasing data from or re-writing data into an EEPROM device, the erase operation or the re-write operation can be implemented in a manner of one storage unit by another. Therefore, data can be stored into, read out from or eased from the memory devices for more than one time.

Referring to FIG. 1, an existing EEPROM device is illustrated. The EEPROM device includes: a semiconductor substrate 200; an erase gate 201 disposed on a first portion of the semiconductor substrate 200; two float gate dielectric layers 202 disposed on a second and a third portion of the semiconductor substrate 200 respectively, wherein the first portion is between the second portion and the third portion; two float gates 203 respectively disposed on the float gate dielectric layers 202; two control gate dielectric layers 204 respectively disposed on the float gates 203; two control gates 205 respectively disposed on the control gate dielectric layers 204; a tunneling oxide layer 206 disposed between the word line 201 and a first sidewall formed by the float gates 203 and the control gates 205, a spacer 210 disposed on a second sidewall formed by the float gates 203 and the control gates 205; a selecting dielectric layer 207 disposed beside the spacer 210; a selecting gate disposed on the selecting dielectric layer 207; a first doping region 209 disposed beside the selecting gate 208; and a second doping region 211 disposed under the erase gate 201.

Accordingly, in existing EEPROM devices, dimensions (specifically, the widths) of the erase gate and the float gate are substantially the same, thus an area of the contact surface therebetween is fixed. Therefore, a coupling ratio of the float gate to the control gate is limited. As a result, efficiency and stability of the EEPROM device during the erase operation may be reduced, that is, erasing performance of the EEPROM device is not satisfactory.

Furthermore, when implementing an erasing operation to the EEPROM device, all float gates disposed along the same line with the erasing gate will be erased. In other words, each float gate can not be erased separately.

Therefore, erasing performance of the existing EEPROM devices needs to be improved. Furthermore, an EEPROM device whose float gates can be separately erased is demanded.

SUMMARY

According to one embodiment of the present disclosure, a method for forming an EEPROM device is provided, including:

providing a semiconductor substrate formed with a plurality of active regions therein, wherein each active region extends along a first direction, and the plurality of active regions are arranged one after another along a second direction vertical with the first direction;

forming float gate polycrystalline silicon layers extending along the first direction and respectively disposed on the active regions, where each float polycrystalline silicon layer has a width larger than that of the active region disposed thereunder;

forming control gate dielectric material layers respectively overlaying the float gate polycrystalline silicon layers;

forming a control gate polycrystalline silicon layer overlaying exposed part of the semiconductor substrate and the control gate dielectric material layers;

forming a hard mask layer disposed on the control gate polycrystalline silicon layer and having a plurality of first openings formed therein, wherein each of the first openings extends along the second direction and exposes a part of a top surface of the control gate polycrystalline silicon layer, wherein the first openings are arranged one after another along the first direction;

forming first spacers respectively on sidewalls of each of the first openings;

etching the control gate polycrystalline silicon layer, the control gate dielectric material layers, and the float gate polycrystalline silicon layers by taking the first spacers of the first openings and the hard mask layer as masks, so as to form second openings;

forming an isolation oxide layer overlaying inner surfaces of each second opening;

forming a word line in each second opening and on the isolation oxide layer;

removing the hard mask layer; and etching, by taking the first spacers and the word lines as masks, the control gate polycrystalline silicon layer, the control gate dielectric material layers, and the float gate polycrystalline silicon layers, so as to form a memory unit corresponding to each word line, wherein the remained float gate polycrystalline silicon layers disposed on two sides of the word line constitute two float gates of the memory unit, the remained control gate dielectric material layers disposed on two sides of the word line and respectively on the two float gates constitute two control gate dielectric layers of the memory unit, and the remained control gate polycrystalline silicon layers disposed on two sides of the word line and respectively on the two control gate dielectric layers constitute two control gates of the memory unit.

In some embodiments, the plurality of active regions are formed by:
- etching the semiconductor substrate to form a plurality of grooves therein, wherein each groove extends along the first direction, and the plurality of grooves are arranged one after another along the second direction vertical with the first direction; and
- filling up the plurality of grooves with isolation material to form shallow trench isolation structures, such that portions of the semiconductor substrate between the shallow trench isolation structures constitute the active regions.

In some embodiments, forming the float gate polycrystalline silicon layers includes:
- forming a plurality of float gate dielectric layers respectively on the active regions, wherein each float gate dielectric layer extends along the first direction, and the plurality of float gate dielectric layers are arranged one after another along the second direction;
- forming a first polycrystalline silicon layer overlaying the float gate dielectric layers and the shallow trench isolation structures; and
- etching the first polycrystalline silicon layer, so as to from the float gate polycrystalline silicon layers each of which covers the corresponding float gate dielectric layer and portion of the shallow trench isolation structures.

In some embodiments, a distance between edges of the float gate polycrystalline silicon layer and the active region on the same side ranges from 0.05 micrometer to 0.25 micrometer.

In some embodiments, the method further includes: forming a second spacer covering lateral surfaces of each float gate and each control gate, wherein the lateral surfaces are not covered by the isolation oxide layer In some embodiments, the method further includes: forming two bit line doping regions in the active regions on two sides of each memory unit.

In some embodiments, the bit line doping region has a width smaller than that of the float gate.

In some embodiments, the two bit line doping regions of the active region are respectively connected with two bit lines.

According to one embodiment of the present disclosure, an EEPROM device is provided, including:
- a semiconductor substrate formed with a plurality of active regions therein, wherein each active region extends along a first direction, and the plurality of active regions are arranged one after another along a second direction vertical with the first direction;
- a word line disposed on one of the active regions and extends along the second direction;
- float gate dielectric layers respectively disposed on two sides of the word line;
- float gates respectively disposed on the float gate dielectric layers, wherein each float gate has a width larger than that of the active region disposed thereunder;
- control gate dielectric layers respectively disposed on the float gates;
- control gates respectively disposed on the control gate dielectric layers;
- an isolation oxide layer disposed between the word line and lateral surfaces of the float gates and the control gates; and
- bit line doping regions disposed in the active region beside the float gates and the control gates, and away from the word line.

In some embodiments, a distance between edges of the float gate polycrystalline silicon layer and the active region on the same side ranges from 0.05 micrometer to 0.25 micrometer.

In some embodiments, the device further includes a shallow trench isolation structure disposed in the semiconductor substrate and between two neighboring active regions.

In some embodiments, the bit line doping regions of the active region are respectively connected with different bit lines.

According to one embodiment of the present disclosure, a method for implementing an erase operation to the EEPROM device is provided, including:
- applying a first zero voltage to the word line;
- applying a negative voltage to a first control gate disposed on a first side of the word line;
- applying a second zero voltage to a second control gate disposed on a second side of the word line;
- applying a positive voltage to a first bit line doping region disposed beside the first control gate; and
- applying a third zero voltage to a second bit line doping region disposed beside the second control gate, thus the erase operation can be implemented to the float gate disposed underneath the first control gate.

In some embodiments, the negative voltage applied to the first control gate ranges from −6V to −8V.

In some embodiments, the positive voltage applied to the first bit line doping region ranges from 3V to 5V.

According to one embodiment of the present disclosure, a method for implementing an program operation to the EEPROM device recited above is provided, including:
- applying a first positive voltage, to the word line;
- applying a second positive voltage to a first control gate disposed on a first side of the word line, wherein the second positive voltage is larger than the first positive voltage;
- applying a third positive voltage to a second control gate disposed on a second side of the word line, wherein the third positive voltage is larger than the first positive voltage and smaller than the second positive voltage;
- applying a forth voltage to a first bit line doping region disposed on a third side of the first control gate, wherein the forth positive voltage is larger than the first positive voltage and smaller than the second positive voltage; and
- applying a zero voltage to a second bit line doping region disposed on a forth side of the second control gate, thus the program operation can be implemented to the float gate disposed underneath the first control gate.

According to one embodiment of the present disclosure, a method for implementing an read operation to the EEPROM device recited above is provided, including:
- applying a first positive voltage to the word line;
- applying a first zero voltage to a first control gate disposed on a first side of the word line;
- applying a second positive voltage to a second control gate disposed on a second side of the word line, wherein the second positive voltage is smaller than the first positive voltage;
- applying a third voltage to a first bit line doping region disposed on a third side of the first control gate, wherein the third positive voltage is smaller than the second positive voltage; and
- applying a second zero voltage to a second bit line doping region disposed on a forth side of the second control gate through a metal line, thus the read operation can be implemented to the float gate disposed underneath the first control gate.

Accordingly, the float gate polycrystalline silicon layer has a width larger than that of the active region disposed thereunder, thus the float gate formed thereafter will have a width larger than that of the active region as well. Therefore, the float gate formed may have a larger volume (or a surface area) without changing an integration level of the EEPROM device. Furthermore, a contact surface between the float gate and a control gate can be enlarged, thus a coupling ratio of the float gate to the control gate (a ratio of a first capacitance formed between the float gate and the control gate to a second capacitance formed between the float gate and the outside) can be enlarged. Thus, operation voltages required on control gate when implementing an erase operation or a program operation to the EEPROM device can be reduced. Therefore, stability and efficiency of the EEPROM device during the erase operation and the program operation can be improved. At the same time, power consumed can be reduced as well.

Furthermore, the bit line doping region formed has a width equal to that of the active region, and the float gate has a width larger than that of the active region. Accordingly, the bit line doping region has an area smaller than that of the float gate. Thus, a coupling ratio of the bit line doping region to the float gate can be reduced. Therefore, when an erase operation is implemented to the float gate, a voltage difference between the bit line doping region and the float gate can be enlarged, thus FN tunneling tend to be occurred so as to erase electrons in the float gate easily.

In addition, as bit line doping regions are connected to different bit lines, an erase operation can be just implemented to one single float gate.

DETAILED DESCRIPTION

In order to clarify the objects, characteristics and advantages of the present disclosure, embodiments of the present disclosure will be described in detail in conjunction with the accompanying drawings. The disclosure will be described with reference to certain embodiments. Accordingly, the present disclosure is not limited to the embodiments disclosed. It will be understood by those skilled in the art that various changes may be made without departing from the spirit or scope of the disclosure.

Referring to FIGS. 2-17, a process for forming an EEPROM device is illustrated. The process include following steps from S101 to S115.

Figure 1:
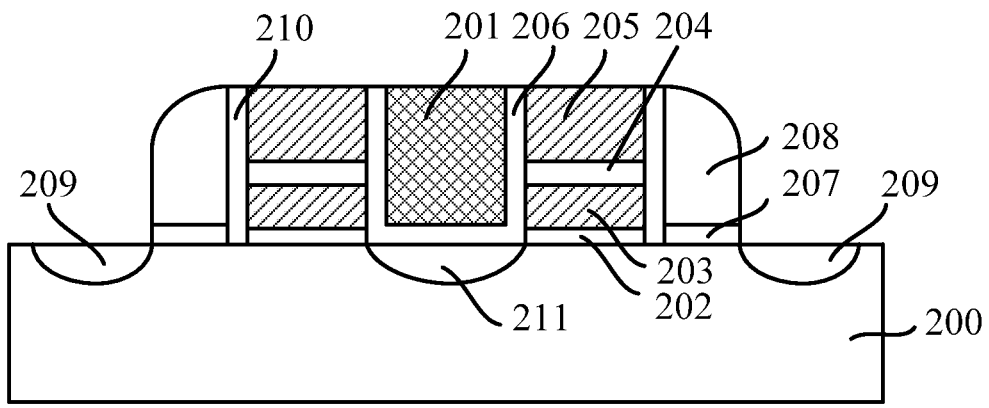
FIG. 1 schematically illustrates an existing split-gated flash memory device.
Figure 2:
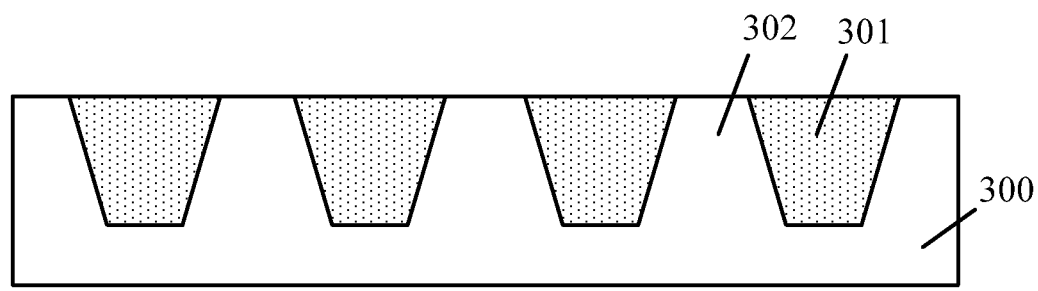
FIGS. 2-17 schematically illustrate a process for forming an EEPROM device according to one embodiment of the present disclosure.

S101, referring to FIG. 2, providing a semiconductor substrate 300 formed with a plurality of active regions 302 therein, wherein each active region 302 extends along a first direction, and the plurality of active regions 302 are arranged one after another along a second direction vertical with the first direction.

In some embodiments, the semiconductor substrate 300 may be made of silicon (Si), germanium (Ge), silicon germanium (SiGe), or silicon carbide (SiC). In some embodiments, the semiconductor substrate 300 may be made of silicon on insulator (SOI) or germanium on insulator (GOI). In some embodiments, the semiconductor substrate 300 may be made of other materials, such as III-V group compounds, for example, the semiconductor substrate 300 may be made of gallium arsenide. In some embodiments, a doping process may be implemented to the semiconductor substrate 300, so as to change electrical parameters of the semiconductor substrate 300.

The semiconductor substrate 300 further includes one or more shallow trench isolation structures 301 which are arranged along the first direction as well. Wherein the shallow trench isolation structures 301 and the active regions 302 are arranged in a staggered pattern. The shallow trench isolation structures 301 are used for electrical isolating two neighboring active regions 302.

Each active region 302 may have a width ranging from 0.1 micrometer to 0.3 micrometer. The active regions 302 are used for forming the EEPROM device thereon in following steps.

The active regions 302 and the shallow trench isolation structures 301 may be formed by: forming a hard mask layer (not shown in FIG. 2) on the semiconductor substrate 300; forming a plurality of openings on the hard mask layer to expose a plurality portions of the semiconductor substrate 300 respectively, wherein positions of the openings are corresponded to positions of grooves formed in following steps; etching the semiconductor substrate 300 by taking the openings as masks, so as to forming a plurality of grooves which are extended along the first direction and parallel to each other; and filling up the grooves with isolation material, so as to form the shallow trench isolation structures 301. Accordingly, the active regions 302 are defined between two shallow trench isolation structures 301.

The isolation material may be silicon oxide, silicon nitride, or the like. The isolation material may be configured to have a single layer structure or a double-layer stacked structure.

Filling up the grooves with the isolation material may be implemented by a Chemical Vapor Deposition (CVD) process. After filling up the grooves with the isolation material, a chemical mechanical planarization process may be implemented to remove the isolation material on a surface of the semiconductor substrate 300, and to remove the hard mask layer. Accordingly, the shallow trench isolation structures 301 are formed in the grooves.

Figure 3:
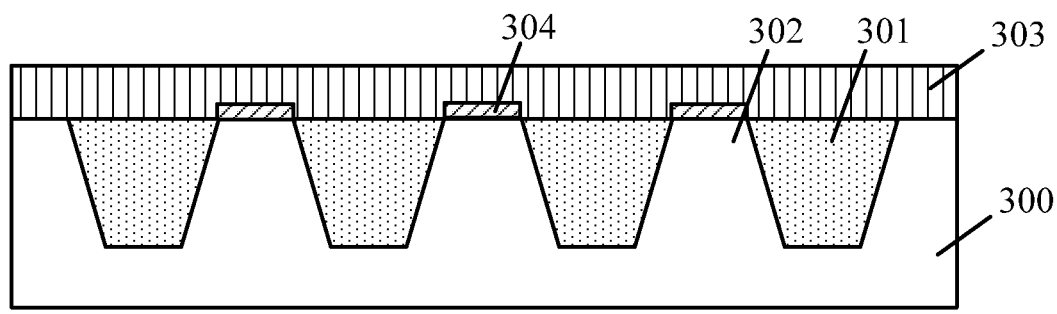

S103, referring to FIG. 3, forming a float gate dielectric layer 304 extending along the first direction and respectively disposed on the active regions 302; and forming a first polycrystalline silicon layer 303 overlaying the float gate dielectric layers 304 and the shallow trench isolation structures 301.

The float gate dielectric layers 304 may be made of silicon oxide. In some embodiments, the float gate dielectric layers 304 may be formed by a thermal oxidation process or a wet oxidation process. In some embodiments, the float gate dielectric layers 304 may be formed by a deposition process.

The first polycrystalline silicon layer 303 formed is used for forming a float gate polycrystalline silicon layer in following steps. The first polycrystalline silicon layer 303 may have a thickness ranging from 300 angstrom to 600 angstrom.

Figure 4:
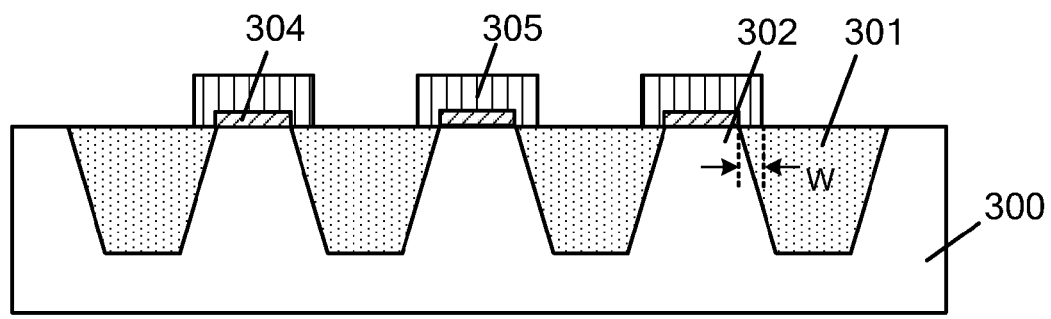

S 105, referring to FIG. 4, etching the first polycrystalline silicon layer 303 (referring to FIG. 3), so as to form a float gate polycrystalline silicon layer 305 on each of the float gate dielectric layers 304. The float gate polycrystalline silicon layer 305 may also disposed on a portion of the shallow trench isolation structures 301, thus the float gate polycrystalline silicon layer 305 has a width larger than that of the active region 302.

The float gate polycrystalline silicon layers 305 are used for forming float gates of the EEPROM device in following steps.

Accordingly, a plurality of float gate polycrystalline silicon layers 305 are formed along the first direction, and two neighboring float gate polycrystalline silicon layers 305 are isolated from each other.

Figure 5:
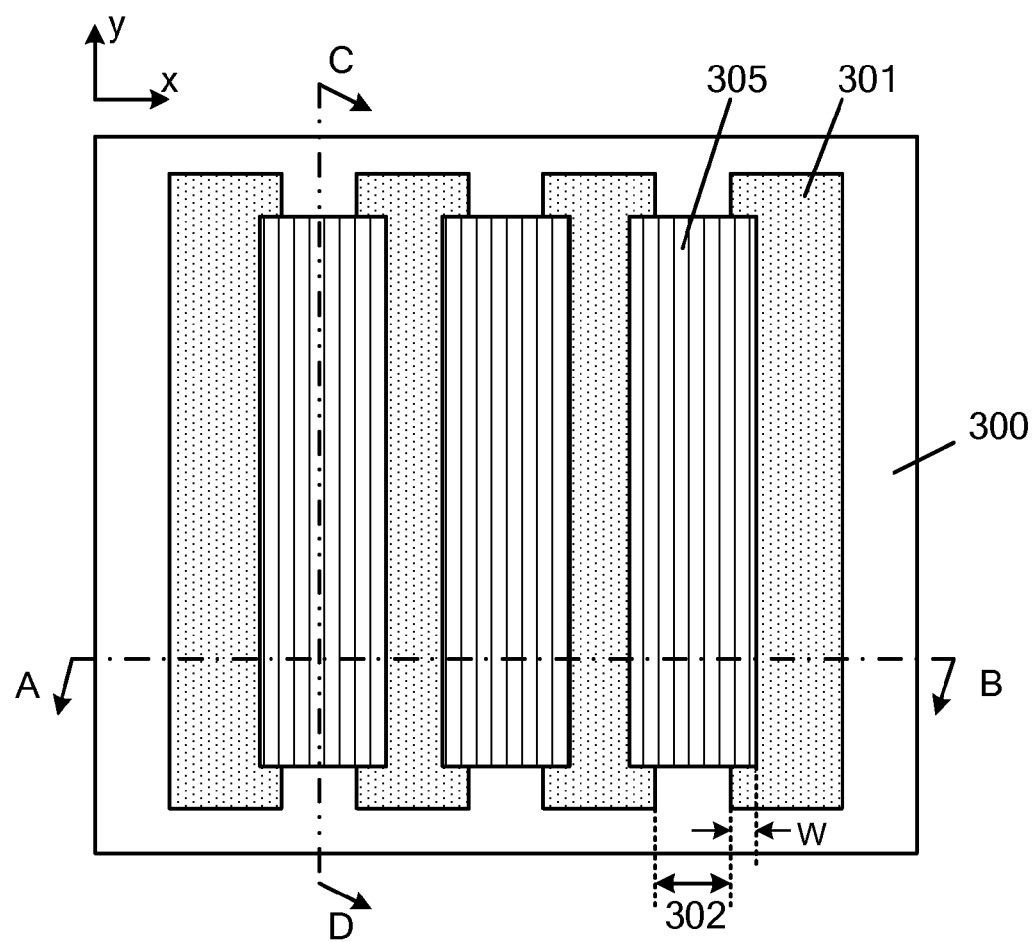

Referring to FIG. 5, a top view of FIG. 4 is illustrated. FIG. 4 is a sectional view of FIG. 5 along cutting line AB. The float gate polycrystalline silicon layers 305 are disposed along the first direction (y direction as shown in FIG. 5). The float gate polycrystalline silicon layer 305 has a width larger than that of the corresponding active region 302 disposed thereunder. In other words, the float gate polycrystalline silicon layer 305 not only overlays the corresponding active region 302 (or the float gate dielectric layer 304), but also overlays portion of the shallow trench isolation structures 301. It should be noted that, the width of the float gate polycrystalline silicon layer 305 and the width of the active region 302 refer to corresponding dimensions along x direction.

Since the float gate polycrystalline silicon layer 305 has a width larger than that of the corresponding active region 302, float gate formed in following steps will have a width larger than that of the corresponding active region 302 as well. Accordingly, float gate formed can have a larger volume (or a surface area) without changing an integration level of the EEPROM device. Therefore, a contact surface between the float gate and a control gate formed later can be enlarged, thus a coupling ratio of the float gate to the control gate (a ratio of a first capacitance formed between the float gate and the control gate to a second capacitance formed between the float gate and the outside) can be enlarged as well. Accordingly, operation voltages required on the control gate when implementing an erase operation or a program operation to the EEPROM device can be reduced. Therefore, stability and efficiency of the EEPROM device during the erase operation and the program operation can be improved.

An edge of the float gate polycrystalline silicon layer 305 and an edge of the active region 302 define a distance W ranging from 0.05 micrometer to 0.2 micrometer.

Figure 6:
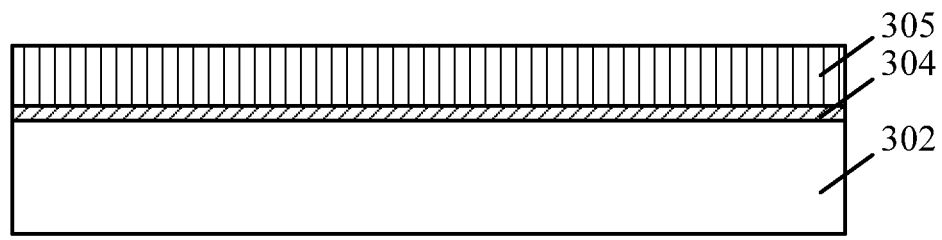

Referring to FIG. 6, a sectional view of FIG. 5 along cutting line CD is illustrated. As shown, the float gate dielectric layers 304 are formed on the active regions 302, and the float gate polycrystalline silicon layers 305 are formed on the float gate dielectric layers 304.

Figure 7:
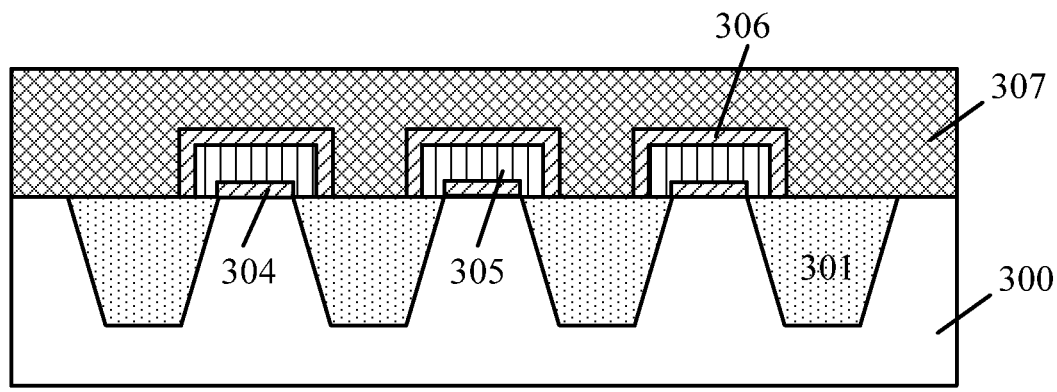

S107, referring to FIG. 7, forming a control gate dielectric material layer 306 overlaying each of the float gate polycrystalline silicon layers 305, wherein the control gate dielectric material layer 306 is formed on sidewalls and top surface of the corresponding float gate polycrystalline silicon layer 305; and forming a control gate polycrystalline silicon layer 307 overlaying the exposed semiconductor substrate 300 and the control gate dielectric material layer 306.

The control gate dielectric material layer 306 may be configured to have a multi-layer stacked structure. For example, the control gate dielectric material layer 306 may be a three-layer stacked structure consisting of a first silicon oxide layer, a silicon nitride layer and a second silicon oxide layer.

In some embodiments, the control gate dielectric material layer 306 may overlay the sidewalls and the top surface of the corresponding float gate polycrystalline silicon layer 305. In some embodiments, the control gate dielectric material layer 306 may also overlay the exposed semiconductor substrate and the shallow trench isolation structures.

The control gate polycrystalline silicon layer 307 is used for forming a control gate of the EEPROM device in following steps.

Figure 8:
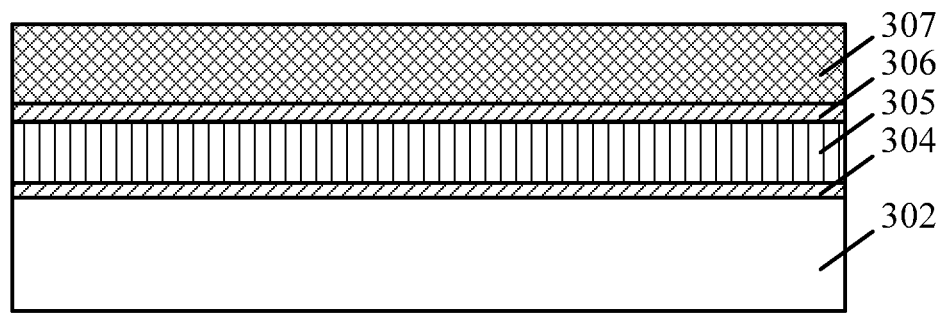

Referring to FIG. 8, forming the control gate dielectric material layer 306 on the float gate polycrystalline silicon layer 305 showed in FIG. 6, and forming the control gate polycrystalline silicon layer 307 on the control gate dielectric material layer 306 are illustrated.

In some embodiments, the control gate polycrystalline silicon layer 307 may have a thickness ranging from 500 angstrom to 700 angstrom.

Figure 9:
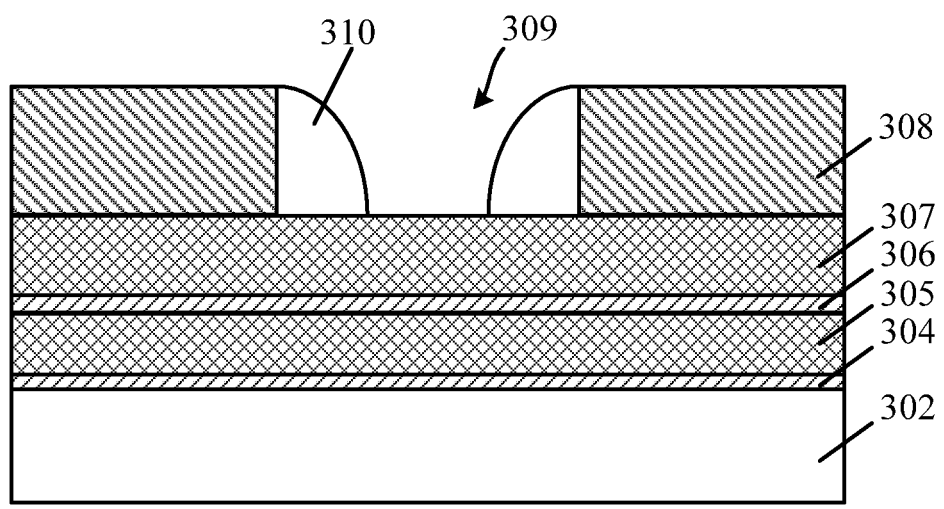
Figure 10:
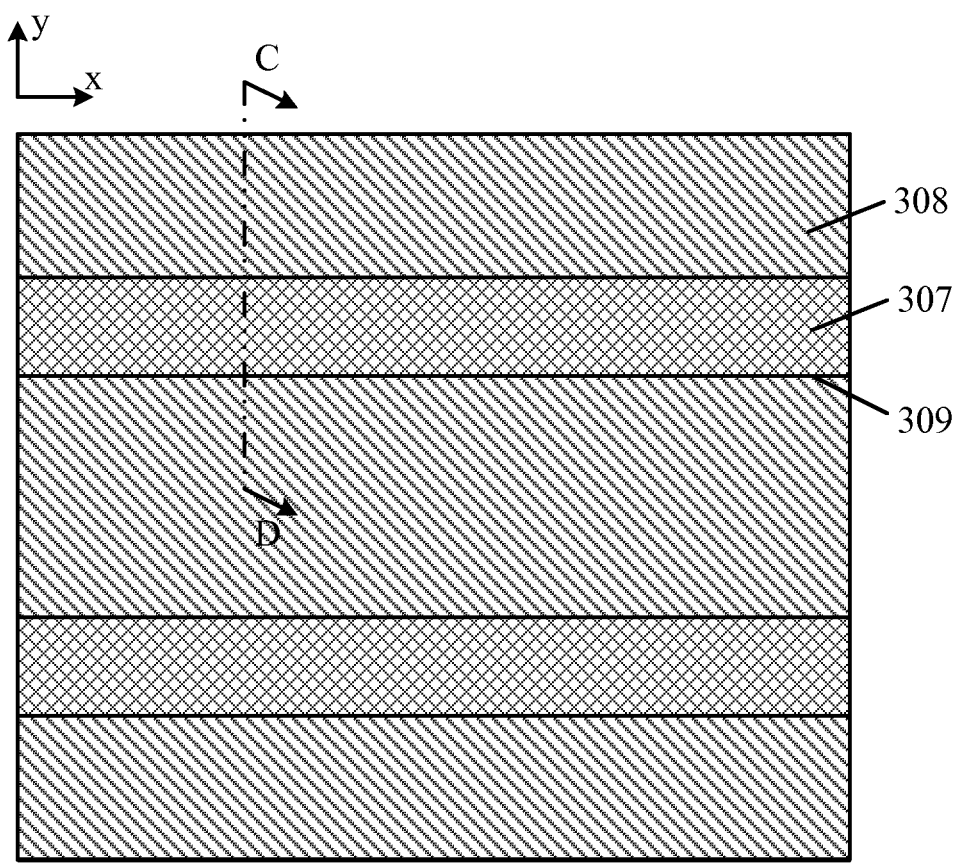

Referring to FIG. 9 and FIG. 10, a hard mask layer 308 is formed on the control gate polycrystalline silicon layer 307, wherein the hard mask layer 308 has a plurality of first openings 309 each of which extends along a second direction and exposes a part of a top surface of the control gate polycrystalline silicon layer 307, wherein the first openings 309 are arranged one after another along the first direction vertical with the second direction; a first spacer 310 is formed on inner surface of each first opening. It should be noted that, FIG. 9 is a sectional view of FIG. 10 along cutting line CD.

It should be noted that, FIG. 9 is a sectional view of FIG. 10 along cutting line CD. In some embodiments, the second direction is x direction as shown in FIG. 10. The first spacer 310 is not showed in FIG. 10.

The hard mask layer 308 may be made of silicon nitride. The first spacer 310 may be made of material different from the hard mask layer 308. For example, the first spacer 310 may be made of silicon oxide.

The first spacers 310 may be made by: forming a spacer material layer on bottom surfaces of the openings 309 and a top surface of the hard mask layer 308; implementing an etching process to the spacer material layer to form the first spacers 310 on sidewalls of the openings 309, wherein the etching process is implemented by a mask-less etching process.

Figure 11:
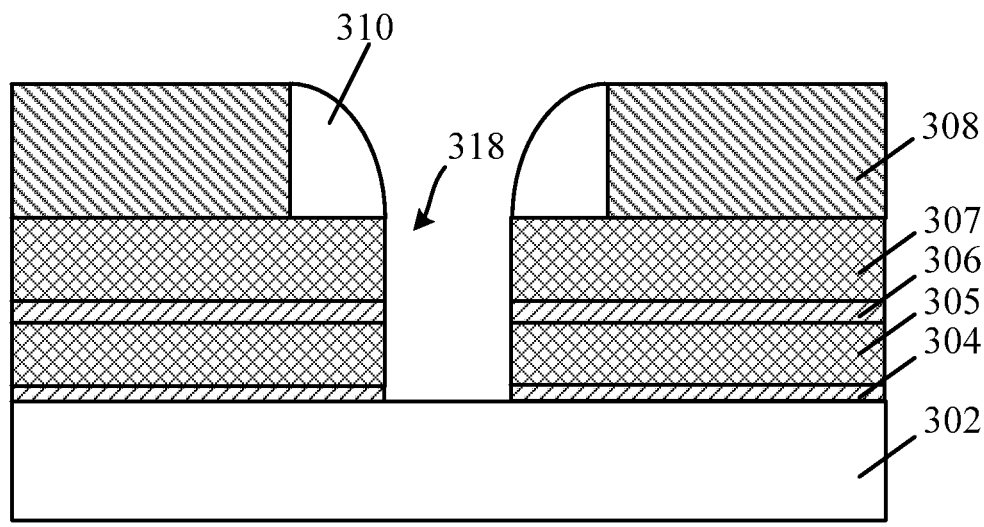

S109, referring to FIG. 11, etching the control gate polycrystalline silicon layer 307, the control gate dielectric material layer 306, and the float gate polycrystalline silicon layer 305 by taking the first spacers 310 of the first openings 309 and the hard mask layer 308 as masks, so as to form a plurality of second openings 318.

A dry etching process may be employed to etch the control gate polycrystalline silicon layer 307, the control gate dielectric material layer 306, and the float gate polycrystalline silicon layer 305. Etching gas of the dry etching may include at least one selected from a group consisting of HBr, Cl2, and SF6. Thereafter, a wet etching process may be implemented to the float gate 304 left on the active region 302.

It should be noted that, the second openings 318 include corresponding first openings 309. Specifically, when the second openings 318 are formed, the first openings 309 are extended into the second openings 318.

Figure 12:
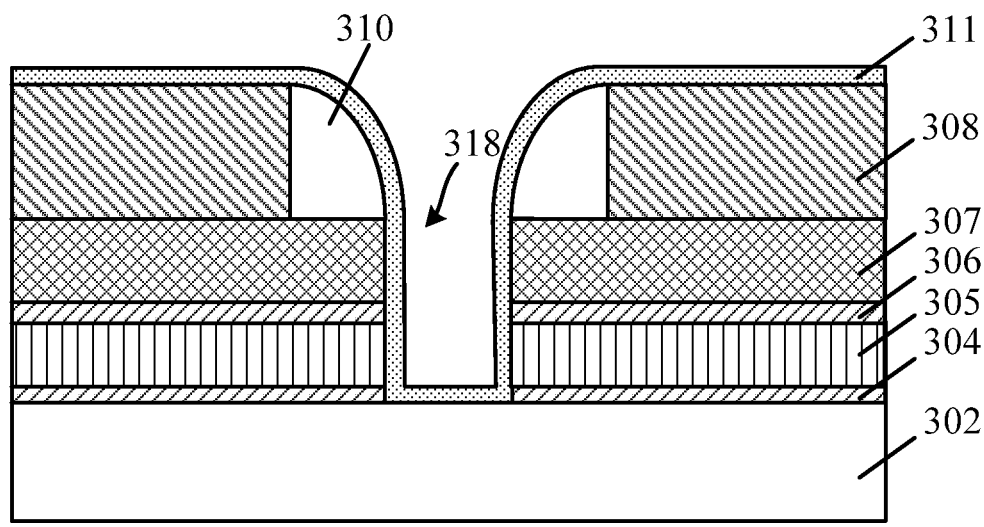

S111, referring to FIG. 12, forming an isolation oxide layer 311 overlaying inner surface of each second opening 318.

In some embodiments, the isolation oxide layer 311 may be formed by a CVD process, such as an Atomic layer deposition (ALD) process. In some embodiments, the isolation oxide layer 311 may be formed by an oxidation process.

In some embodiments, the isolation oxide layer 311 may also overlay the first spacers 310 and the top surface of the hard mask layer 308.

Figure 13:
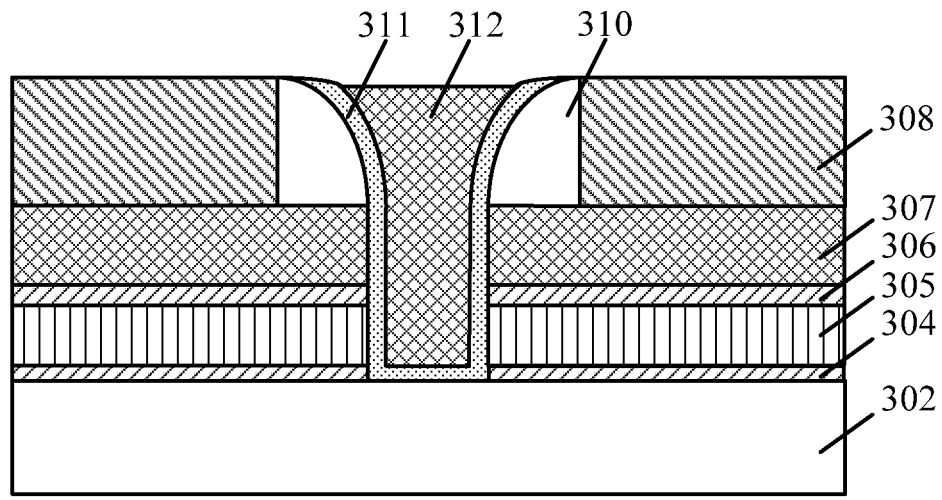

S113, referring to FIG. 13, forming word lines 312 in the second openings 318 and on the isolation oxide layer 311.

The word lines 312 may be made of polycrystalline silicon.

The word lines 312 may be formed by: forming a third polycrystalline silicon layer to fill up the second openings 318, wherein the third polycrystalline silicon layer overlays the isolation oxide layer 311 and the hard mask layer 308; implementing a Chemical Mechanical Planarization (CPM) process to remove the third polycrystalline silicon layer and the isolation oxide layer 311 formed on the hard mask layer 308 until surface of the hard mask layer 308 is exposed. Accordingly, the word lines 312 are formed in the second openings 318.

Thereafter, a protective layer (not shown in FIG. 13) may be formed on surface of each word line 312. The protective layer may be made of silicon oxide. The protective layers can be used for preventing word lines 312 from being etched when implementing an etching process to the control gate polycrystalline silicon layer 307 and the float gate polycrystalline silicon layer 305 in following steps. Therefore, performance of the EEPROM formed can be improved.

The protective layer may be formed by a thermal oxidation process. Thus, silicon oxide layers (the protective layer) can be formed on the word lines 312 in a self-aligned and selective manner. Therefore, steps for forming the protective layer can be simplified, and accuracy of the process can be improved.

Figure 14:
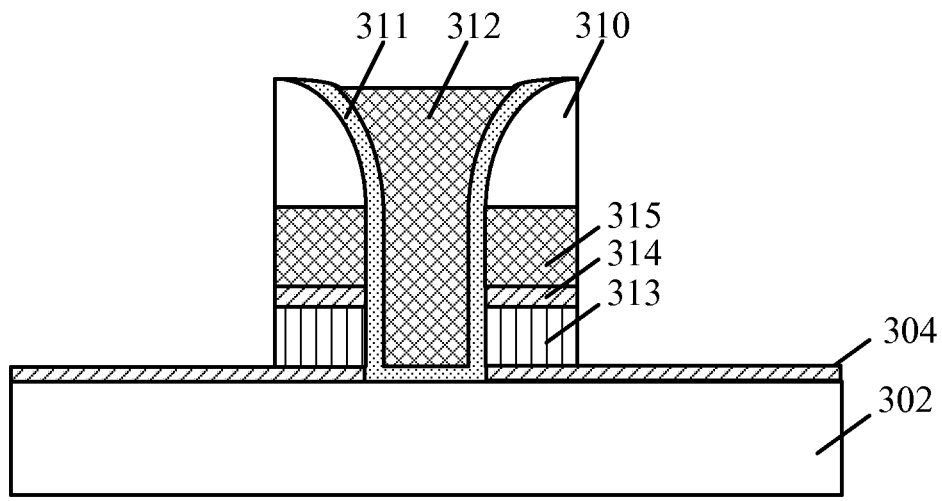

S115, referring to FIG. 14, removing the hard mask layer 308 (referring to FIG. 13); etching, by taking the first spacers 310 as masks, the remained control gate polycrystalline silicon layer 307, the control gate dielectric material layer 306, the float gate polycrystalline silicon layer 305, and the float gate dielectric layers 304, so as to form a float gate 313 on each active region 302 respectively disposed on two sides of the word line 312, a control gate dielectric layer 314 on the float gate 313, and the control gate on the control gate dielectric layer 314.

In some embodiments, a wet etching process may be employed to remove the hard mask layer 308. For example, the hard mask layer 308 may be removed by phosphoric acid solution.

A dry etching process may be employed to etch the remained control gate polycrystalline silicon layer 307, the control gate dielectric material layer 306, the float gate polycrystalline silicon layer 305, and the float gate dielectric layers 304. An etching gas of the dry etching process may include at least one selected from a group consisting of HBr, $Cl_2$, and $SF_6$.

Figure 15:
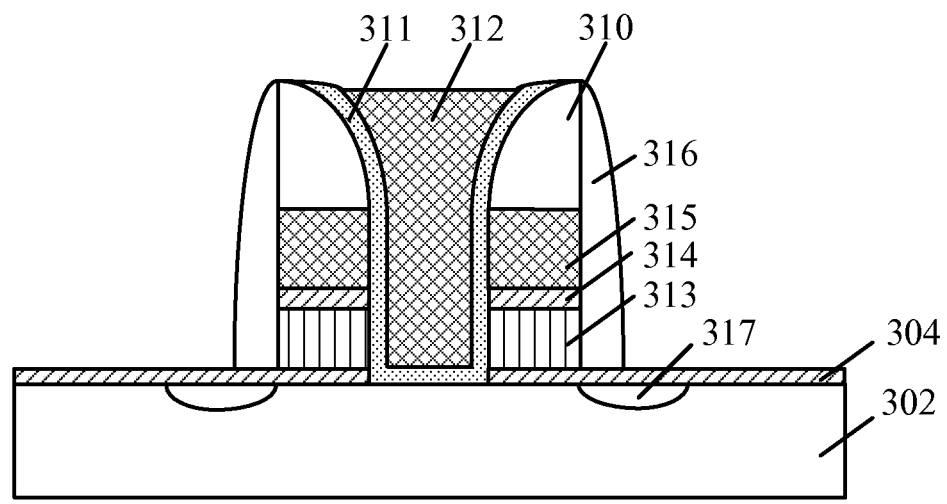
Figure 16:
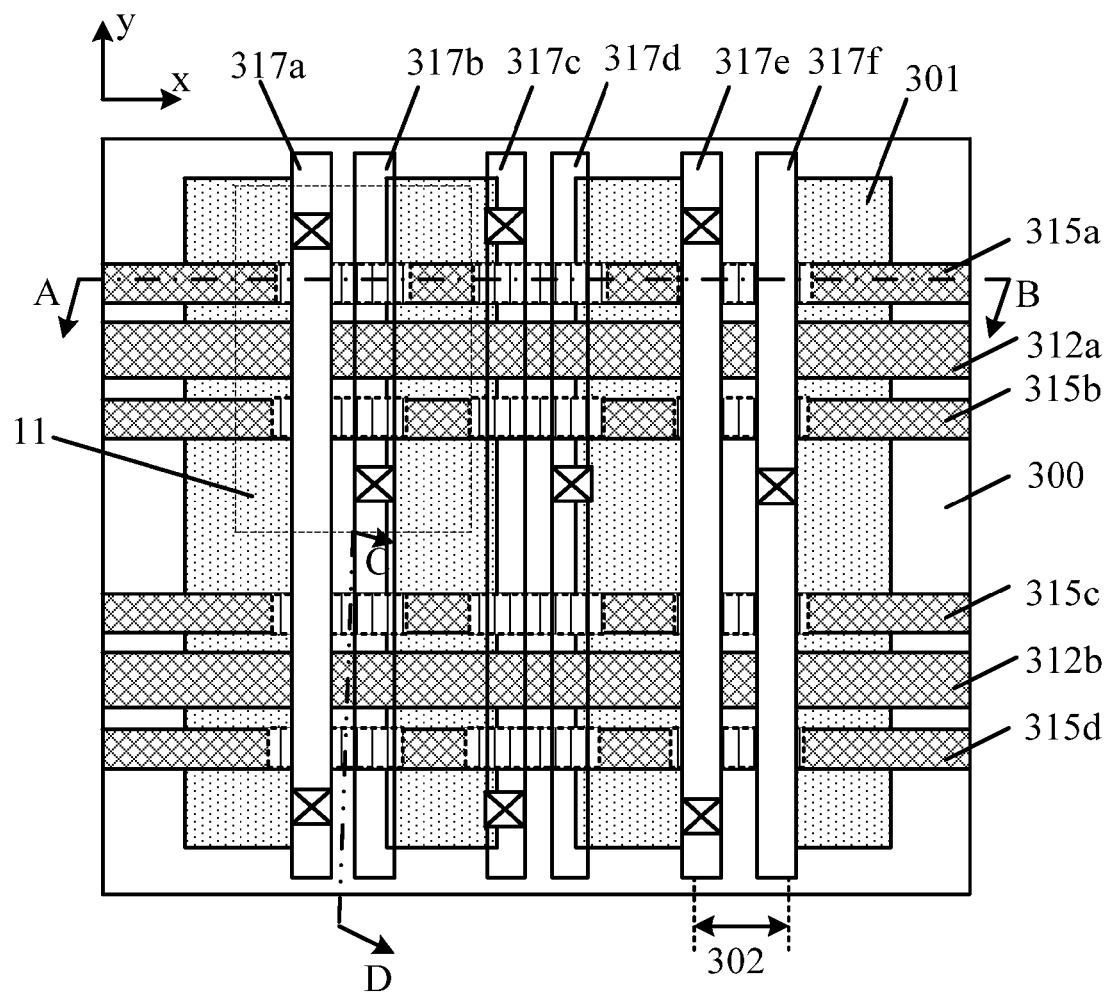
Figure 17:
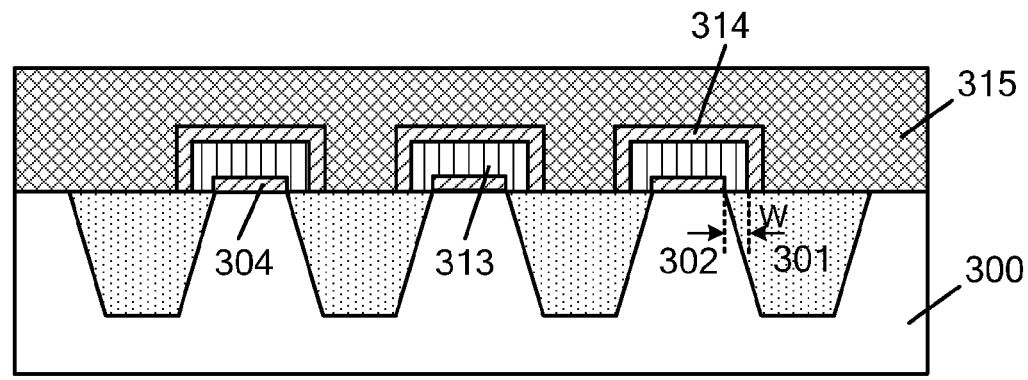

Referring to FIG. 15 to FIG. 17, FIG. 15 is a sectional view of FIG. 16 along a cutting line CD, and FIG. 17 is a sectional view of FIG. 16 along a cutting line AB. S117, forming a second spacer 316 covering lateral surfaces of each float gate 313 and each control gate 315, wherein the lateral surfaces are not covered by the isolation oxide layer, wherein the lateral surfaces are far way from the word lines 312; and forming two bit line doping regions 317 in the active region on two sides of each word lines 312.

The second spacer 316 may be configured to have a single-layer structure or a multi-layer stacked structure. For example, the second spacer 316 may be configured to be a double stacked structure including a silicon oxide layer and a silicon nitride layer.

The bit line doping region 317 may be formed by an ion injecting process with certain angle.

In some embodiments, a portion of the bit line doping region 317 is disposed underneath the float gate 313. The bit line doping region 317 has a width (along x direction) equal to that of the active region 302, and the float gate 313 has a width larger than that of the active region 302. Accordingly, the bit line doping region 317 has an area smaller than that of the float gate 313. Thus, a coupling ratio of the bit line doping region 317 to the float gate 313 is reduced. Therefore, when an erase operation is implemented to the float gate 313, a voltage difference between the bit line doping region 317 and the float gate 313 can be enlarged, FN tunneling tends to be occurred so as to erase electrons in the float gate 313 easily.

Referring to FIG. 15, a memory unit of the EEPROM device is illustrated. The memory unit includes: a word line 312 disposed on one of the active regions 302 (or the semiconductor substrate) along the second direction; two float gates 313 respectively disposed on two sides of the word line 312 and on the active region 302; control gate dielectric layers 314 respectively disposed on the float gates 313; control gates 315 respectively disposed on the control gate dielectric layers 314; an isolation oxide layer 311 disposed between the word line 312 and lateral surfaces of the float gate 313 and the control gate 315; float gate dielectric layers 304 respectively disposed between the float gates 313 and the active region 302; and two bit line doping regions 317 respectively disposed beside the float gates 313 and the control gates 315.

Referring to FIG. 16, an EEPROM device including a plurality of memory units 11 is illustrated, wherein the memory units 11 are arranged in an array.

Two bit line doping regions of each storage unit are electrically connected with different bit lines, so as to implement an erase operation to one single float gate 313 in each memory unit. Each of the bit lines includes: metal lines (317a to 317f), and plugs (not labeled but indicated by blocks with crossed diagonals therein as shown in FIG. 16) for connecting the metal lines to the bit line doping regions respectively. For example, as shown in FIG. 16, one bit line doping region of the memory unit disposed on the first line and the first row is connected to the metal line 317a through a first plug, another bit line doping region of the storage unit is connected to the metal line 317b through a second plug. Therefore, when implementing the erase operation to one float gate 313 of the memory unit 11, a voltage can be applied to corresponding bit line doping region through metal line 317a or metal line 317b, so as to implement the erase operation to the corresponding float gate 313.

Referring to FIG. 16 and FIG. 17, in the EEPROM device, the control gates 315 of different memory units disposed along a same line (along x direction or the second direction) are connected together. For example, the control gate 315a which belongs to different memory units is an integral structure. The same is true with control gates 315b to 315d. In addition, the word lines 312 of different memory units disposed on the same line (along x direction or the second direction) are also connected together. For example, the word line 312a which belongs to different memory units is a integral structure. The same is true with word line 312b.

Referring still to FIG. 15 to FIG. 17, an EEPROM device according to above recited method is illustrated. The EEPROM device includes follow parts.

A semiconductor substrate 300 formed with a plurality of active regions 302 therein, wherein each active region 302 extends along a first direction (y direction), and the plurality of active regions 302 are arranged one after another along a second direction (x direction) vertical with the first direction.

A word line 312 disposed on the active region 302, wherein the word line 312 extends along the second direction.

Two float gate dielectric layers 304 respectively disposed on two sides of the word line 312 and disposed on the active region; float gates 313 disposed on the float gate dielectric layers 304 respectively; control gate dielectric layers 314 disposed on the float gates 313 respectively; and control gates 315 disposed on the control gate dielectric layers 314 respectively, wherein the float gate 313 has a width larger than that of the active region 302 disposed thereunder.

An isolation oxide layer 311 disposed between the word line 312 and lateral surfaces of the float gates 313 and the control gates 315.

Bit line doping regions 317 respectively disposed on the active regions which are disposed beside the float gates 313 and the control gates 315 and away from the word line 312.

In some embodiments, an edge of the float gate 313 and an edge of the second active region 302 define a distance W ranging from 0.05 micrometer to 0.25 micrometer. Accordingly, a coupling ratio of the float gate to the control gate can be enlarged, a coupling ratio of the bit line doping region to the float gate can be reduce as well, without changing an integration level of the EEPROM device. Therefore, stability and efficiency of the EEPROM device during the erase operation and the program operation can be improved.

In some embodiments, the semiconductor substrate 300 further has shallow trench isolation (STI) structures 301 disposed between neighboring active regions 302.

In some embodiments, the bit line doping region 317 may have a width smaller than that of the float gate 302.

A method for implementing an erase operation to the EEPROM device is provided.

The method includes: applying a first zero voltage to the word line; applying a negative voltage to a first control gate disposed on a first side of the word line; applying a second zero voltage to a second control gate disposed on a second side of the word line; applying a positive voltage to a first bit line doping region disposed beside the first control gate; applying a third zero voltage to a second bit line doping region disposed beside the second control gate. Accordingly, the erase operation can be implemented to the float gate disposed underneath the first control gate.

It should be noted that, the zero voltages are defined as the first zero voltage, the second voltage and the third voltage, which is used for distinguishing the zero voltages applied to different structures from each other and can not be taken as limitations. The same is true for the first and second control gates, and the first and second bit line doping regions.

In some embodiments, the negative voltage applied to the first control gate ranges from −6V to −8V, the positive voltage applied to the first bit line doping region ranges from 3V to 5V.

Figure 18:
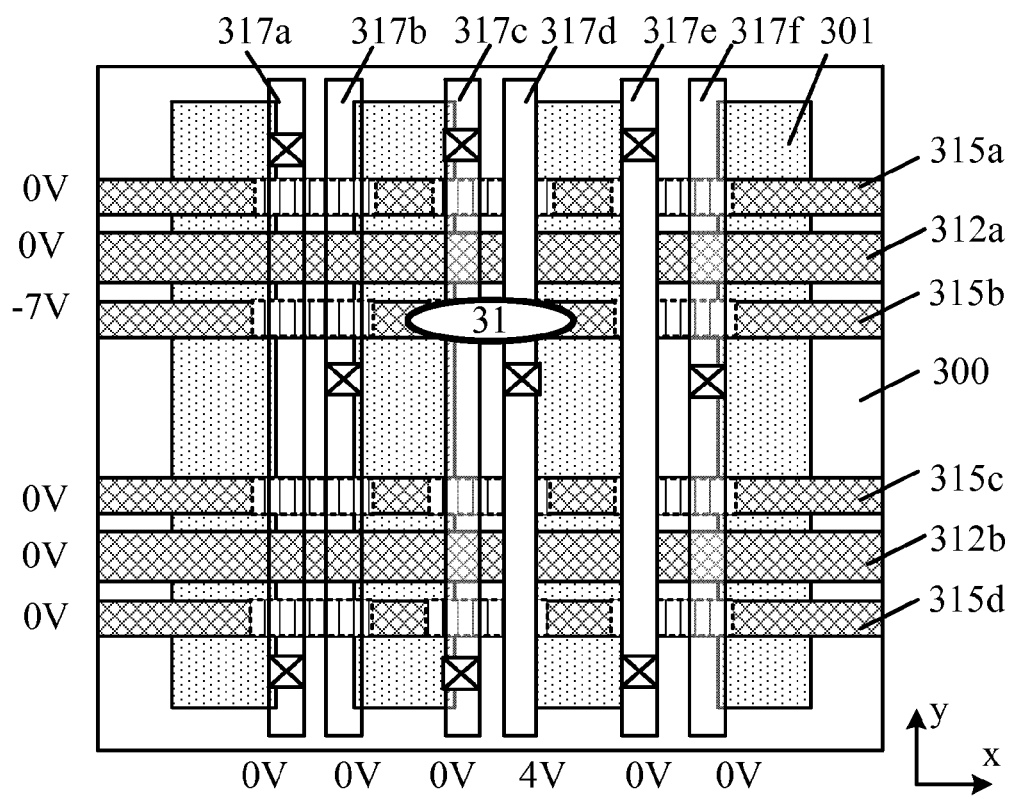
FIG. 18 schematically illustrates an erase operation of the EEPROM device when voltages are applied to the EEPROM device.

Referring to FIG. 18, an example for implementing the erase operation to a target float gate 31 is illustrated, wherein the target float gate 31 refers the float gate that the erase operation implemented to. Specifically, a first zero voltage is applied to the word line 312a; a first negative voltage, such as −7 V, is applied to a first control gate 315b disposed on a first side of the word line 312a; a second zero voltage is applied to a second control gate 315a disposed on a second side of the word line 312a; a first positive voltage, such as 4V, is applied to a first bit line doping region disposed beside the first control gate 315b through metal line 317d; a third zero voltage is applied to a second bit line doping region disposed beside the second control gate 315a through metal line 317c. Accordingly, the erase operation can be implemented to the target float gate 31 disposed underneath the first control gate 315b.

When implementing the erase operation to the target float gate 31, other word lines (such as word line 312b), other control gates (such as control gate 315c and control gate 315d), and other bit lines or metal lines (such as metal lines 317a, 317b, 317e, and 317f) are all applied to a zero voltage or suspended.

Accordingly, though the method recited above, the erase operation can be implemented to a single float gate of the EEPROM device.

Figure 19:
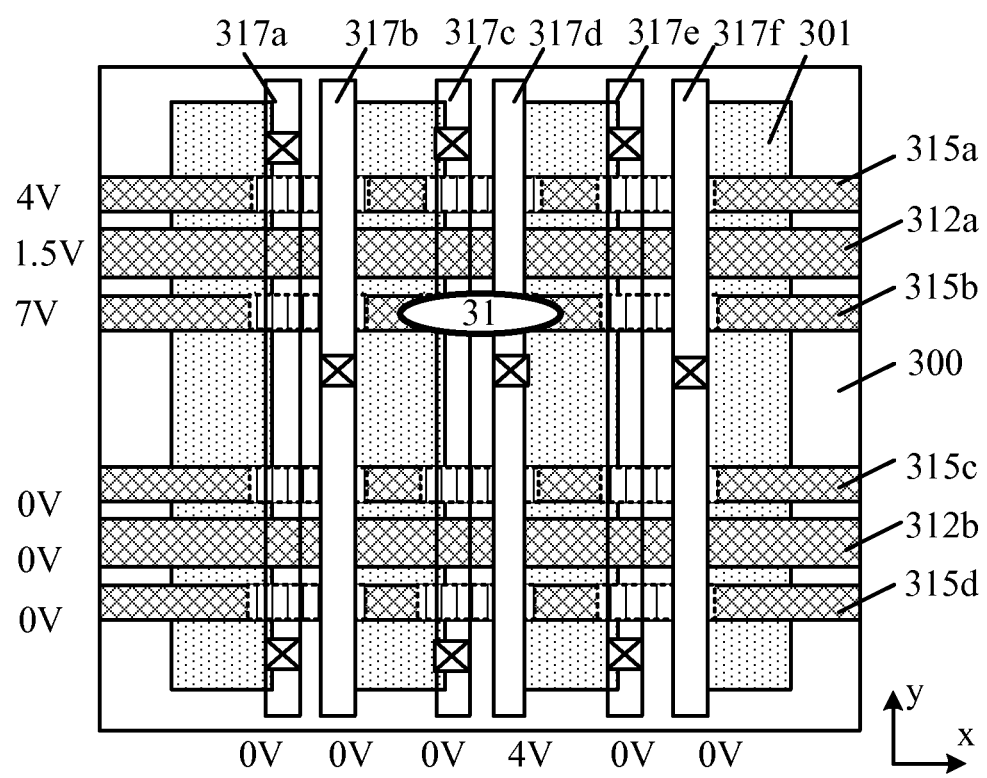
FIG. 19 schematically illustrates a programming operation of the EEPROM device when voltages are applied to the EEPROM device.

Furthermore, a method for implementing a program operation to the EEPROM device is illustrated. Referring to FIG. 19, taking the target float gate 31 where the program operation is implemented to for an example. The method includes: applying a first positive voltage, such as 1.5 V, to the word line 312a; applying a second positive voltage to a first control gate 315b disposed on a first side of the word line 312a, wherein the second positive voltage is larger than the first positive voltage, such as 7V; applying a third positive voltage to a second control gate 315a disposed on a second side of the word line 312a, wherein the third positive voltage is larger than the first positive voltage and smaller than the second positive voltage, such as 4V; applying a forth voltage to a first bit line doping region disposed on a third side of the first control gate 315b through a metal line 317d, wherein the forth positive voltage is larger than the first positive voltage and smaller than the second positive voltage, such as 4V; applying a zero voltage to a second bit line doping region disposed on a forth side of the second control gate 315a through a metal line 317c. Accordingly, the program operation can be implemented to the target float gate 31 disposed underneath the first control gate 315b.

When implementing the program operation to the target float gate 31, other word lines (such as word line 312b), other control gates (such as control gate 315c and control gate 315d), and other bit lines or metal lines (such as metal lines 317a, 317b, 317e, and 317f) are all applied to a zero voltage or suspended.

Figure 20:
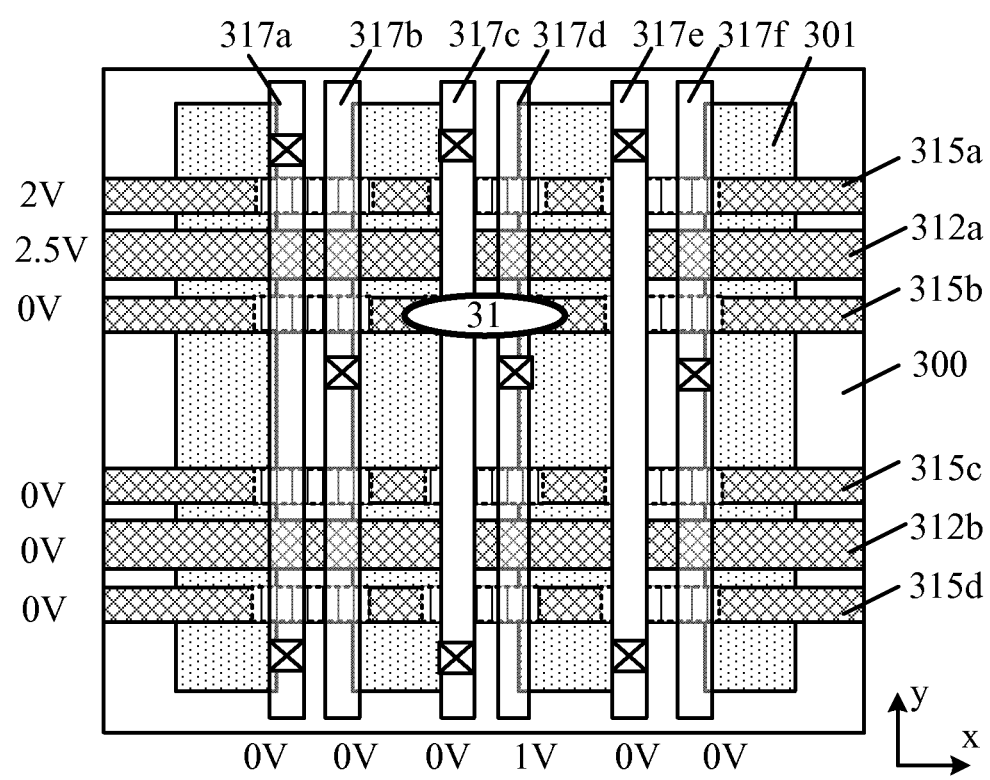
FIG. 20 schematically illustrates a read operation of the EEPROM device when voltages are applied to the EEPROM device.

Furthermore, a method for implementing a read operation to the EEPROM device is illustrated. Referring to FIG. 20, taking the target float gate 31 where the read operation is implemented to for an example. The method includes: applying a first positive voltage, such as 2.5 V, to the word line 312a; applying a first zero voltage to a first control gate 315b disposed on a first side of the word line 312a; applying a second positive voltage to a second control gate 315a disposed on a second side of the word line 312a, wherein the second positive voltage is smaller than the first positive voltage, such as 2V; applying a third voltage to a first bit line doping region disposed on a third side of the first control gate 315b through a metal line 317d, wherein the third positive voltage is smaller than the second positive voltage, such as 1V; applying a second zero voltage to a second bit line doping region disposed on a forth side of the second control gate 315a through a metal line 317c.

Accordingly, the read operation can be implemented to the target float gate 31 disposed underneath the first control gate 315b.

When implementing the read operation to the target float gate 31, other word lines (such as word line 312b), other control gates (such as control gate 315c and control gate 315d), and other bit lines or metal lines (such as metal lines 317a, 317b, 317e, and 317f) are all applied to a zero voltage or suspended.

Although the present disclosure has been disclosed above with reference to preferred embodiments thereof, it should be understood by those skilled in the art that various changes may be made without departing from the spirit or scope of the disclosure. Accordingly, the present disclosure is not limited to the embodiments disclosed.

What is claimed is:

1. A method for forming an EEPROM device, comprising:
   providing a semiconductor substrate formed with a plurality of active regions therein, wherein each active region extends along a first direction, and the plurality of active regions are arranged one after another along a second direction vertical with the first direction;

forming float gate polycrystalline silicon layers extending along the first direction and respectively disposed on the active regions, where each float polycrystalline silicon layer has a width larger than that of the active region disposed thereunder;

forming control gate dielectric material layers respectively overlaying the float gate polycrystalline silicon layers;

forming a control gate polycrystalline silicon layer overlaying exposed part of the semiconductor substrate and the control gate dielectric material layers;

forming a hard mask layer disposed on the control gate polycrystalline silicon layer and having a plurality of first openings formed therein, wherein each of the first openings extends along the second direction and exposes a part of a top surface of the control gate polycrystalline silicon layer, wherein the first openings are arranged one after another along the first direction;

forming first spacers respectively on sidewalls of each of the first openings;

etching the control gate polycrystalline silicon layer, the control gate dielectric material layers, and the float gate polycrystalline silicon layers by taking the first spacers of the first openings and the hard mask layer as masks, so as to form second openings;

forming an isolation oxide layer overlaying inner surfaces of each second opening;

forming a word line in each second opening and on the isolation oxide layer;

removing the hard mask layer; and etching, by taking the first spacers and the word lines as masks, the control gate polycrystalline silicon layer, the control gate dielectric material layers, and the float gate polycrystalline silicon layers, so as to form a memory unit corresponding to each word line, wherein the remained float gate polycrystalline silicon layers disposed on two sides of the word line constitute two float gates of the memory unit, the remained control gate dielectric material layers disposed on two sides of the word line and respectively on the two float gates constitute two control gate dielectric layers of the memory unit, and the remained control gate polycrystalline silicon layers disposed on two sides of the word line and respectively on the two control gate dielectric layers constitute two control gates of the memory unit.

2. The method according to claim 1, wherein the plurality of active regions are formed by:

etching the semiconductor substrate to form a plurality of grooves therein, wherein each groove extends along the first direction, and the plurality of grooves are arranged one after another along the second direction vertical with the first direction; and filling up the plurality of grooves with isolation material to form shallow trench isolation structures, such that portions of the semiconductor substrate between the shallow trench isolation structures constitute the active regions.

3. The method according to claim 2, wherein forming the float gate polycrystalline silicon layers comprises:

forming a plurality of float gate dielectric layers respectively on the active regions, wherein each float gate dielectric layer extends along the first direction, and the plurality of float gate dielectric layers are arranged one after another along the second direction;

forming a first polycrystalline silicon layer overlaying the float gate dielectric layers and the shallow trench isolation structures; and etching the first polycrystalline silicon layer, so as to from the float gate polycrystalline silicon layers each of which covers the corresponding float gate dielectric layer and portion of the shallow trench isolation structures.

4. The method according to claim 3, wherein a distance between edges of the float gate polycrystalline silicon layer and the active region on the same side ranges from 0.05 micrometer to 0.25 micrometer.

5. The method according to claim 1, further comprising: forming a second spacer covering lateral surfaces of each float gate and each control gate, wherein the lateral surfaces are not covered by the isolation oxide layer.

6. The method according to claim 5, further comprising: forming two bit line doping regions in the active regions on two sides of each memory unit.

7. The method according to claim 6, wherein the bit line doping region has a width smaller than that of the float gate.

8. The method according to claim 6, wherein the two bit line doping regions of the active region are respectively connected with two bit lines.

9. An EEPROM device, comprising:

a semiconductor substrate formed with a plurality of active regions therein, wherein each active region extends along a first direction, and the plurality of active regions are arranged one after another along a second direction vertical with the first direction;

a word line disposed on one of the active regions and extends along the second direction;

float gate dielectric layers respectively disposed on two sides of the word line;

float gates respectively disposed on the float gate dielectric layers, wherein each float gate has a width larger than that of the active region disposed thereunder;

control gate dielectric layers respectively disposed on the float gates;

control gates respectively disposed on the control gate dielectric layers;

an isolation oxide layer disposed between the word line and lateral surfaces of the float gates and the control gates; and bit line doping regions disposed in the active region beside the float gates and the control gates, and away from the word line.

10. The device according to claim 9, wherein a distance between edges of the float gate polycrystalline silicon layer and the active region on the same side ranges from 0.05 micrometer to 0.25 micrometer.

11. The device according to claim 9, further comprising a shallow trench isolation structure disposed in the semiconductor substrate and between two neighboring active regions.

12. The device according to claim 9, wherein the bit line doping regions of the active region are respectively connected with different bit lines.

13. A method for implementing an erase operation to the EEPROM device according to claim 9, comprising:

applying a first zero voltage to the word line;

applying a negative voltage to a first control gate disposed on a first side of the word line;

applying a second zero voltage to a second control gate disposed on a second side of the word line;

applying a positive voltage to a first bit line doping region disposed beside the first control gate; and applying a third zero voltage to a second bit line doping region disposed beside the second control gate, thus the erase operation can be implemented to the float gate disposed underneath the first control gate.

14. The method according to claim 13, wherein the negative voltage applied to the first control gate ranges from −6V to −8V.

15. The method according to claim 13, wherein the positive voltage applied to the first bit line doping region ranges from 3V to 5V.

* * * * *